(12) United States Patent
Findeklee et al.

(10) Patent No.: US 10,895,613 B2
(45) Date of Patent: Jan. 19, 2021

(54) TUNABLE RF COIL FOR MAGNETIC RESONANCE IMAGING

(71) Applicant: KONINKLIJKE PHILIPS N.V., Eindhoven (NL)

(72) Inventors: Christian Findeklee, Norderstedt (DE); Christoph Leussler, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/324,594

(22) PCT Filed: Aug. 16, 2017

(86) PCT No.: PCT/EP2017/070776
§ 371 (c)(1),
(2) Date: Feb. 11, 2019

(87) PCT Pub. No.: WO2018/033576
PCT Pub. Date: Feb. 22, 2018

(65) Prior Publication Data
US 2019/0170837 A1   Jun. 6, 2019

(30) Foreign Application Priority Data

Aug. 18, 2016   (EP) ..................................... 16184764

(51) Int. Cl.
*G01R 33/34* (2006.01)
*G01R 33/36* (2006.01)
*G01R 33/422* (2006.01)

(52) U.S. Cl.
CPC . *G01R 33/34069* (2013.01); *G01R 33/34007* (2013.01); *G01R 33/34046* (2013.01); *G01R 33/3628* (2013.01); *G01R 33/422* (2013.01)

(58) Field of Classification Search
CPC ........ G01R 33/34007; G01R 33/34069; G01R 33/34046; G01R 33/3628; G01R 33/422
See application file for complete search history.

(56) References Cited

U.S. PATENT DOCUMENTS

| 4,746,866 A | 5/1988 | Roeschmann |
| 6,252,404 B1 | 6/2001 | Purgill et al. |
| 2006/0173284 A1 | 8/2006 | Ackerman et al. |
| 2008/0060843 A1 | 3/2008 | Ginanneschi |
| 2008/0265891 A1 | 10/2008 | Du et al. |
| 2008/0315878 A1* | 12/2008 | Ham ................. G01R 33/3854 324/318 |

(Continued)

FOREIGN PATENT DOCUMENTS

JP        07155307 A     6/1995

*Primary Examiner* — Gregory H Curran

(57) ABSTRACT

The invention concerns to a radio frequency (RF) body coil (2), for use in a Magnetic Resonance Imaging (MRI) system, comprising: an RF shield (6), an RF coil element (8), distantly arranged from the RF shield (6), and at least one distance setting element (10), arranged and designed in such a way that the relative distance (12) between the RF shield (6) and the RF coil element (8) is adjustable via the distance setting element (10) which may lead to locally deforming the RF coil element (8) and/or the RF shield (6). Thus, a radio frequency coil for use in an Magnetic Resonance Imaging system is provided that can be tuned to desired resonances in a comfortable and economic way.

20 Claims, 3 Drawing Sheets

(56) References Cited

U.S. PATENT DOCUMENTS

| | | |
|---|---|---|
| 2009/0128150 A1 | 5/2009 | Ham et al. |
| 2010/0315085 A1* | 12/2010 | Brown ................ A61B 5/0555 |
| | | 324/309 |
| 2013/0300418 A1 | 11/2013 | Eberler et al. |
| 2013/0335087 A1 | 12/2013 | Shah et al. |
| 2014/0306702 A1 | 10/2014 | Lazar et al. |
| 2015/0102813 A1 | 4/2015 | Dumoulin et al. |
| 2016/0327619 A1 | 11/2016 | Kim et al. |

* cited by examiner

TUNABLE RF COIL FOR MAGNETIC RESONANCE IMAGING

CROSS REFERENCE TO RELATED APPLICATIONS

This application is a U.S. national phase application of International Application No. PCT/EP2017/070776, filed on Aug. 16, 2017, which claims the benefit of EP Application Serial No. 16184764.5 filed on Aug. 18, 2016 and is incorporated herein by reference.

FIELD OF THE INVENTION

The invention relates to a tunable radio frequency (RF) coil for Magnetic Resonance Imaging (MRI), a method for tuning a tunable radio frequency coil in a Magnetic Resonance Imaging system and a Magnetic Resonance Imaging system comprising the tunable radio frequency body coil.

BACKGROUND OF THE INVENTION

Magnetic Resonance Imaging (MRI) is a medical imaging technique used in radiology to image the anatomy and the physiological processes of a subject of interest. MRI uses a magnet to create a strong, uniform, static magnetic field (i.e., the "main magnetic field") and gradient coils to produce smaller amplitude, spatially varying magnetic fields when a current is applied to the gradient coils. When a subject of interest is placed in the main magnetic field, the nuclear spins that are associated with hydrogen nuclei in tissue water become polarized. The magnetic moments that are associated with these spins become preferentially aligned along the direction of the main magnetic field, resulting in a small net tissue magnetization along that axis and the gradient coils encode the MR signal.

RF coils are used to create pulses of RF energy at or near the resonance frequency of the hydrogen nuclei, also referred to herein as the Larmor frequency. These RF coils are used to transmit RF excitation signals and receive resp. detect MR signals used to form the images. For multi transmit MRI applications two types of degenerate RF coils, birdcage coils and the transverse electromagnetic (TEM) coils, are widely used for ultra high field (UHF) imaging and are being introduced in commercial 3T whole body MRI scanners.

The RF coils are generally tuned by capacitors to a desired frequency, e.g., the Larmor frequency. To achieve the desired frequency, the RF shield of the coil is removed and capacitors are added, removed or replaced with another capacitor having a different capacitance. The frequency of the modified RF coil is measured resp. determined to ensure that the RF coil is operating at the desired frequency. However, the RF coil may need to be retuned several times to achieve the desired frequency. Thus, for each retuning operation, the RF shield has to be removed and capacitors are amended until the RF coil is tuned to the desired frequency, which is time and cost consuming.

The Japanese patent application JP 07-155307 discloses an RF coil of which the resonance frequency is changed if the shape of the RF shield with respect to the RF coil is varied. The known RF coil can be detuned to be resonant for different nuclei according to the differences in the gyromagnetic ratio of these nuclei.

SUMMARY OF THE INVENTION

It is desirable to improve the comfort for tuning RF coils and to reduce the time and costs for tuning the RF coil to a desired frequency.

It is therefore an object of the present invention to provide a radio frequency coil for use in an Magnetic Resonance Imaging system that can be tuned to a desired frequency and/or homogeneity in a comfortable and economic way.

The object of the present invention is achieved by the subject-matter of the independent claims. Preferred embodiments of the invention are described in the sub-claims.

In one aspect, the object is achieved by a tunable radio frequency (RF) body coil, for a Magnetic Resonance Imaging (MRI) system, comprising:
- an RF shield,
- an RF coil element, distantly arranged from the RF shield, and
- at least one distance setting element, arranged and designed in such a way that the relative distance between the RF shield and the RF coil element is locally adjustable via the distance setting element by locally deforming the RF coil element and/or the RF shield.

Accordingly, the RF body coil comprises an RF coil element, an RF shield and a distance setting element, preferably a plurality of distance setting elements. The distance setting element is arranged and designed in such a way that the relative distance between the RF shield and the RF coil element is locally adjustable via the distance setting element. By reducing or extending the distance between the RF shield and the RF coil element, the RF shield and/or the RF coil element is locally deformed and the relative distance between the RF shield and the RF coil element is changed. Amending the relative distance between the RF coil element and the RF shield changes properties of the RF coil element. For example, the inductance depends on the cross-sectional area of the filed reflux and may be approximately proportional to the distance between the RF coil element and the RF shield. Also, the homogeneity of the RF field depends on the symmetry of the structure. Due to a specific deformation of the RF coil element and/or RF shield the radial symmetry can be adjusted and a higher RF homogeneity can be achieved. Thus, the RF body coil can be tuned to resonance in a comfortable and economic way by amending the relative distance between the RF shield and the RF coil element via the distance setting element.

A RF coil element is typically a birdcage or transverse electromagnetic (TEM) coil or loop coil. In modern high and ultrahigh field MRI systems, the excitation field is produced by radiation elements, which are more or less antennas, such as dipoles, or combination of dipoles and coil loop elements. The individual radiating elements are individually tunable.

The RF body coil is designed for being arranged in an MRI system. Preferably, the RF body coil comprises a cylindrical shape having a longitudinal axis and in a plane perpendicular to the longitudinal direction a radial shape. Alternatively, the RF body coil comprises in a plane perpendicular to the longitudinal direction an elliptical or asymmetric shape. Preferably, the asymmetric shape comprises in a plane perpendicular to the longitudinal direction a straight segment and a circular arc segment, wherein the straight segment is preferably arranged below a patient bridge.

The RF coil element and the RF shield comprises the same geometry as the RF body coil, wherein in a direction perpendicular to the longitudinal direction the shape of the RF coil element is smaller than the one of the RF shield. Thus, the RF shield defines an outer ring resp. outer surface and the RF coil element an inner ring resp. inner surface, wherein the inner surface of the RF coil element defines a cylindrical shaped inner volume. The inner volume is configured to receive a patient table and a volume of interest. Preferably, the distance setting element is operable from the inner volume, resp. inner side. Thus, the relative distance between the RF coil element and the RF shield can be changed in a comfortable and easy way without dismounting the shield of the RF body coil.

In a preferred embodiment of the invention, the distance setting element is configured to mechanically connect the RF coil element and the RF shield to each other. Thus, a direct coupling between the RF coil element and the RF shield is provided. Every amendment of the distance setting element, changing the relative distance of the RF coil element and the RF shield, leads to a local deformation of RF coil element and/or the RF shield and can therefore change the resonance of the RF coil element. Preferably, the RF coil element is a multi element transmit/receive coil array, e.g. a degenerated birdcage, transformer decoupled loop array, where all coil elements are decoupled from each other, a local deformation changes the impedance of the local coil element and thus the resonance frequency. Furthermore, the coupling to next and non next neighbor coil elements is changed by the local deformation. Hence, a distance setting element is provided allowing a sensitive tuning of the RF coil to the desired frequency and/or homogeneity.

In a preferred embodiment of the invention, the distance setting element is configured as a screw mechanism and/or a fixation band and/or an eccentric screw. The screw mechanism and/or the fixation band enables a mechanical connection between the RF coil element and the RF shield. The screw mechanism can be further used as a fixation mean to fix resp. mount the RF body coil to a gradient coil of a MRI system. Preferably the RF coil element and/or the RF shield comprises threads for receiving a screw of the screw mechanism. With respect to a cylindrically shaped RF coil, the screw can be preferably inserted in the threads of the RF body coil either from an inner side or an outer side of the RF body coil, mechanically connecting the RF coil element and the RF shield.

The eccentric part of the eccentric screw is preferably arranged in a direction perpendicular to the longitudinal axis of the RF body coil between the RF coil element and the RF shield. Thus, by turning the eccentric screw the distance between the RF coil element and the RF shield can be locally amended. The eccentric screw is adjustable in a direction parallel to the longitudinal direction of the RF body coil. Thus, a distance setting element for comfortably tuning the RF coil element to the desired resonance is provided.

In a preferred embodiment of the invention, the distance setting element is connectable to the RF coil element, the RF shield comprises a feed through aperture arranged in radial direction of the RF shield and the distance setting element is feed through the aperture. Thus, a distance setting element, preferably a screw mechanism, is inserted from an inner side of the RF body coil. The screw mechanism is mechanically connected to the RF coil element and fed through the aperture. There is no mechanical connection between the screw mechanism and the RF shield. When the RF body coil is inserted in the MRI system the distance setting element, resp. screw mechanism is used as a connection mean and is being back anchored with the gradient coil. Tightening the screw mechanism will lead to a deformation of the RF coil element, reducing the relative distance between the RF coil element and the RF shield locally, which can immediately lead to a change of resonance of the RF coil element.

According to a preferred embodiment of the invention, the distance setting element is configured as a fixation band, wherein in a cross-sectional area in a direction perpendicular to the longitudinal axis of the cylindrically arranged RF body coil, the RF shield comprises first connection elements, preferably equidistantly spaced to each other, on a shield surface facing the RF coil element, the RF coil element comprises second connection elements, preferably equidistantly spaced to each other, the first connection elements and the second connections elements are arranged aligned to each other or with an offset to each other, the fixation band is connected between the first connection elements and the second connection elements, and the length of the fixation band is adjustable via the second connections elements. By adjusting the length of the fixation band, the RF coil element and/or the RF shield element can be locally deformed in the area around the first resp. second connection elements. The second connection elements are configured in such a way that they allow to amend the length of the fixation band from the inner volume, resp. inners side. Thus, the RF coil element can be tuned to resonance in a comfortable way.

In a preferred embodiment of the invention, the RF body coil comprises a plurality of distance setting elements. Thus, the relative distance of the RF coil element and the RF shield can be adjusted at several locations. Preferably, in a cross-sectional area in a direction perpendicular to the longitudinal axis of a cylindrically arranged RF body coil, the plurality of distance setting elements is arranged in a radial direction spaced to each other, and spaced to each other in a direction along the longitudinal axis of the RF body coil. More preferably the plurality of distance setting elements are equidistantly spaced to each other.

Generally, the distance between the RF coil element and the RF shield is an air filed space. This space can be used for cooling the RF coil element during operation.

According to a preferred embodiment of the invention, the RF body coil further comprises at least partially a flexible layer disposed between the RF coil element and the RF shield, keeping the RF coil element and the RF shield spaced apart. The flexible layer can reduce vibrations and/or acoustic noise of the RF coil element.

In a preferred embodiment of the invention, the RF body coil further comprises a solid coil former, wherein the RF shield or the RF coil element is arranged on the coil former.

The stiffness of the coil former is usually higher than the stiffness of the flexible layer. Thus, when amending the local distance between the RF coil element and the RF shield, the structural height of the flexible layer is reduced or expanded. In a preferred embodiment of the invention, the coil former and the flexible layer are formed as a double layer package.

The setup of the RF body coil, especially the arrangement of the coil former with respect to the RF coil element, the flexible layer and the RF shield can vary in radial direction of the cylindrically shaped RF body coil. In a preferred embodiment of the invention the coil former comprises an inner surface and an outer surface, and the inner surface is averted to the outer surface, wherein when the RF body coil is arranged in an MRI-system the inner surface faces the center of a patient tunnel of the MRI system, wherein:
  the RF coil element is arranged on the outer surface of the coil former,
  the flexible layer is arranged on the RF coil element, wherein the RF coil element is positioned between the coil former and the flexible layer, and
  the RF shield is arranged on the flexible layer.

According to an alternative setup of the RF body coil, the coil former comprises an inner surface and an outer surface, and the inner surface is averted to the outer surface, wherein when the RF body coil is arranged in an MRI-system the inner surface faces the center of a patient tunnel of the MRI system, wherein:

the RF shield is mounted on the outer surface of the coil former, the flexible layer is arranged on the inner surface of the coil former, and the RF coil element is arranged on the flexible layer, wherein the flexible layer is disposed between the RF coil element and the coil former.

In a preferred embodiment of the invention, the RF coil element comprises a resonator element, preferably a pcb-based resonator, or a plurality of electrically conducting strips.

According to a preferred embodiment of the invention, conducting tape and/or conducting elements are disposed between the RF coil element and the RF shield.

In a preferred embodiment of the invention, the RF coil element is formed as a birdcage coil comprising two circular conductive loops connected by a number of conductive straight elements and using capacitive structures to form a resonator. A local deformation changes the impedance of the local coil element and thus the resonance frequency. Furthermore, the coupling to next and non next neighbor coil elements is changed by the local deformation.

More preferably, the RF coil element is formed as a transverse electromagnetic (TEM) resonator coil. Preferably comprising a plurality of electrically conducting strips.

In a further aspect, the object of the invention is achieved by a method for tuning a radio frequency (RF) body coil comprising:

an RF shield, an RF coil element, distantly arranged from the RF shield, and at least one distance setting element, arranged and designed in such a way that the relative distance between the RF shield and the RF coil element is locally adjustable via the distance setting element by locally deforming the RF coil element and/or the RF shield, wherein the RF body coil is arranged in an MRI system, comprising the steps:

Measuring the frequency of the RF coil element and/or the homogeneity of the RF field;

Adjusting the relative distance between the RF coil element and the RF shield via the distance setting elements by locally deforming the RF coil element and/or the RF shield.

Accordingly, the distance setting element is arranged and designed in such a way that the distance between the RF shield and the RF coil element is locally adjustable via the distance setting element. By reducing or extending the distance between the RF shield and the RF coil element, the RF shield and/or the coil element is locally deformed and the relative distance between the RF shield and the RF coil element is changed. Amending the local distance between the RF coil element and the RF shield changes properties of the RF coil element. Thus, the RF body coil can be tuned to resonance in a comfortable and economic way by amending the relative distance between the RF shield and the RF coil element via the distance setting element.

In a preferred embodiment of the invention, the method further comprises the step of comparing the measured frequency and/or homogeneity of the RF field with values of a desired frequency and/or desired homogeneity of the RF field.

Preferably, the embodiment of the invention further comprises the step of determining a difference of the measured frequency with the value of the desired frequency and/or determining a difference of the measured homogeneity of the RF field with the desired homogeneity of the RF field.

In a preferred embodiment of the invention, the local distance between the RF coil element and the RF shield is adjusted with respect to the determined difference in frequency and/or homogeneity.

In a further aspect, the object of the invention is achieved by a Magnetic Resonance Imaging (MRI) system comprising a radio frequency coil comprising:

an RF shield, an RF coil element, distantly arranged from the RF shield, and at least one distance setting element, arranged and designed in such a way that the relative distance between the RF shield and the RF coil element is locally adjustable via the distance setting element by locally deforming the RF coil element and/or the RF shield.

The features of the preferred embodiments of the inventive of the RF body coil do also apply to the inventive method for tuning the inventive radio frequency (RF) body coil and to the Magnetic Resonance Imaging (MRI) system.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
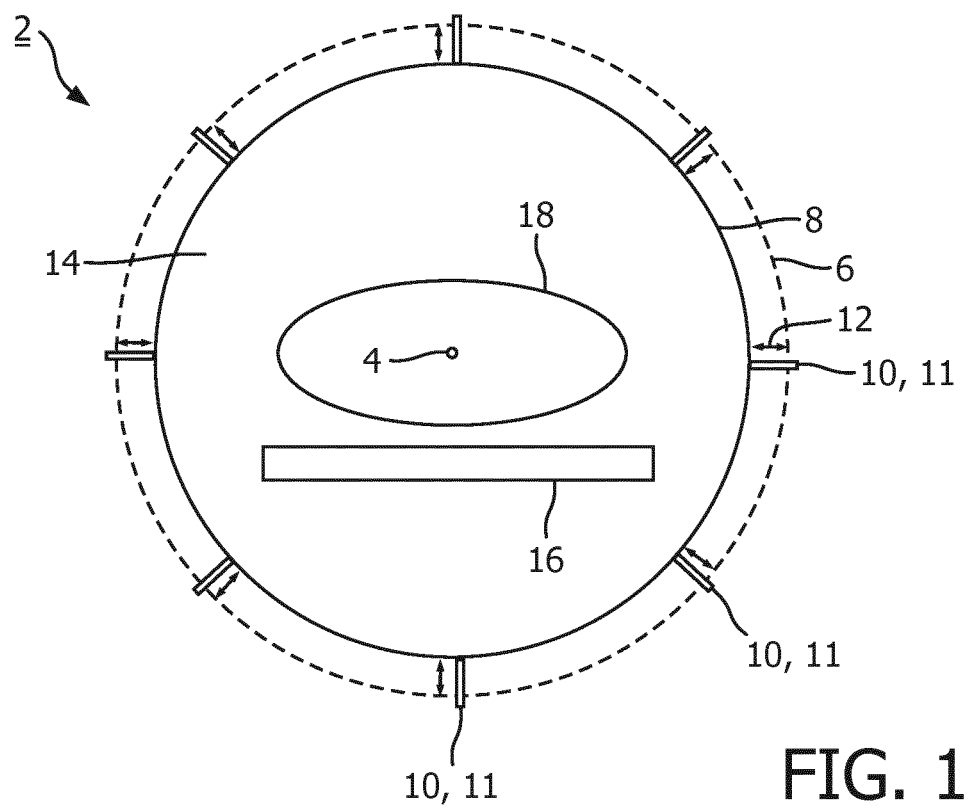
FIG. 1 shows a cross sectional view in a plane perpendicular to the longitudinal axis of a cylindrical RF body coil, according to a preferred embodiment of the invention.

FIG. 1 shows an tunable RF body coil 2 for use in an Magnetic Resonance Imaging (MRI) system. The RF body coil 2 comprises a cylindrical shape having a longitudinal axis 4 and in a direction perpendicular to the longitudinal axis 4 a radial shape. The RF body coil 2 comprises an RF shield 6, and an RF coil element 8, wherein the RF coil element 8 is distantly arranged from the RF shield 6. A plurality of distance setting elements 10 is arranged and designed in such a way that the relative distance 12 between the RF shield 6 and the RF coil element 8 is locally adjustable via the distance setting elements 10 by locally deforming the RF coil element 8 and/or the RF shield 6.

The RF coil element 8 and the RF shield 6 are also arranged in a cylindrical shape, wherein the radial shape of the RF coil element 8 is smaller than the one of the RF shield 6. Thus, the RF shield 6 defines an outer ring resp. outer surface and the RF coil element 8 an inner ring resp. inner surface. The inner ring defines an inner volume 14 that is designed to accommodate a patient table 16 and a volume of interest 18.

The distance setting element 10 is configured as a screw mechanism. The screw mechanism 11 mechanically connects the RF coil element 8 and the RF shield 6 to each other. Thus, a direct coupling between the RF coil element 8 and the RF shield 6 is provided. By turning the screw mechanism 11 the RF coil element 8 and/or the RF shield 6 is locally deformed. The deformation of the RF coil element 8 and/or the RF shield 6 leads to a change in the local distance between the RF shield 6 and the RF coil element 8. Amending the local distance between the RF coil element 8 and the RF shield 6 changes the properties of the RF coil element 8. For example, the inductance depends on the cross-sectional area of the filed reflux and may be approximately proportional to the distance 12 between the RF coil element 8 and the RF shield 6. The screw mechanism 11 is operable from the inner volume 14. Thus, the RF body coil 2 can be tuned to resonance in a comfortable and economic way by amending the relative distance 12 between the RF shield 6 and the RF coil element 8, without the need of removing the RF shield.

Figure 2:
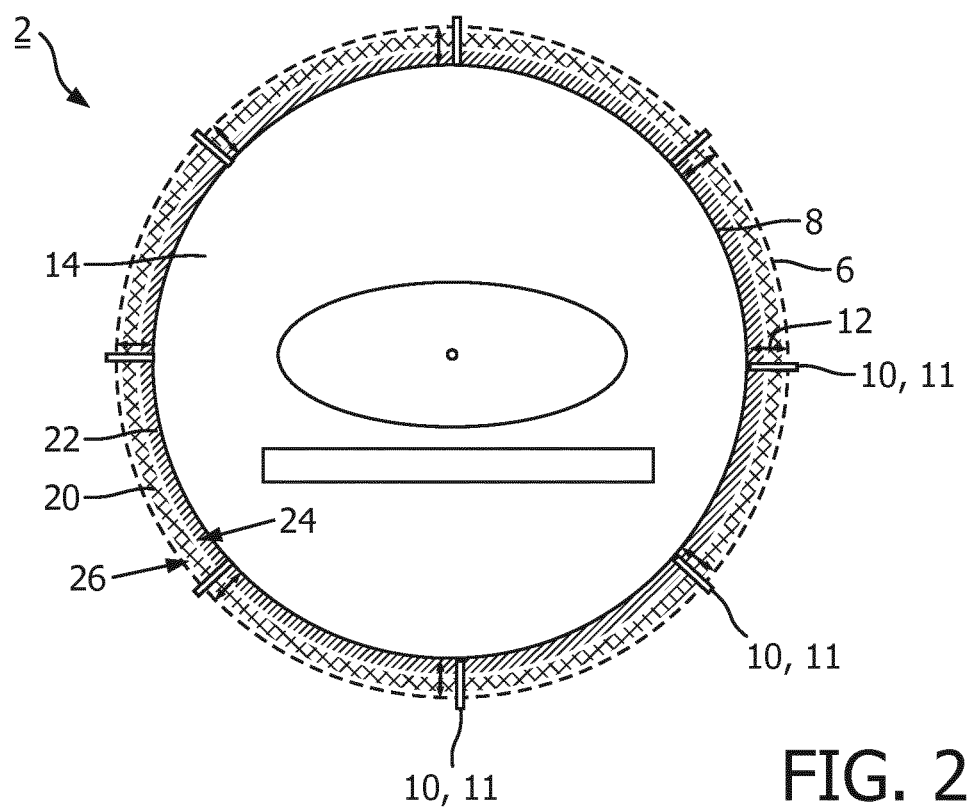
FIG. 2 shows the cross sectional view of the RF body coil, wherein a flexible layer and a coil former are disposed between the RF coil element and the RF shield, according to the preferred embodiment of the invention.

FIG. 2 shows the RF body coil 2 known from FIG. 1, wherein a solid coil former 20 and a flexible layer 22 are disposed between the RF coil element 8 and the RF shield 6. The coil former 20 comprises an inner surface 24 and an outer surface 26, and the inner surface 24 is averted to the outer surface 26, wherein when the RF body coil 2 is arranged in an MRI-system the inner surface 24 faces the center of a patient tunnel of the MRI system resp. the inner volume 14. The RF shield 6 is mounted on the outer surface 26 of the coil former 20. The flexible layer 22 is arranged on the inner surface 24 of the coil former 20, and the RF coil element 8 is arranged on the flexible layer 22, wherein the flexible layer 22 is disposed between the RF coil element 8 and the coil former 20.

The stiffness of the coil former 20 is higher than the stiffness of the flexible layer 22. Due to the fact that the RF shield 6 is mounted on the outer surface 26 of the solid coil former 20 the radial stiffness of the RF shield 6 can be increased.

By turning the screw mechanism 11 the RF coil element 8 is deformed, the structural height of the flexible layer 24 is changed and the relative distance 12 between the RF coil element 8 and the RF shield 6 is adjusted, tuning the RF coil element 8 to resonance.

Figure 3:
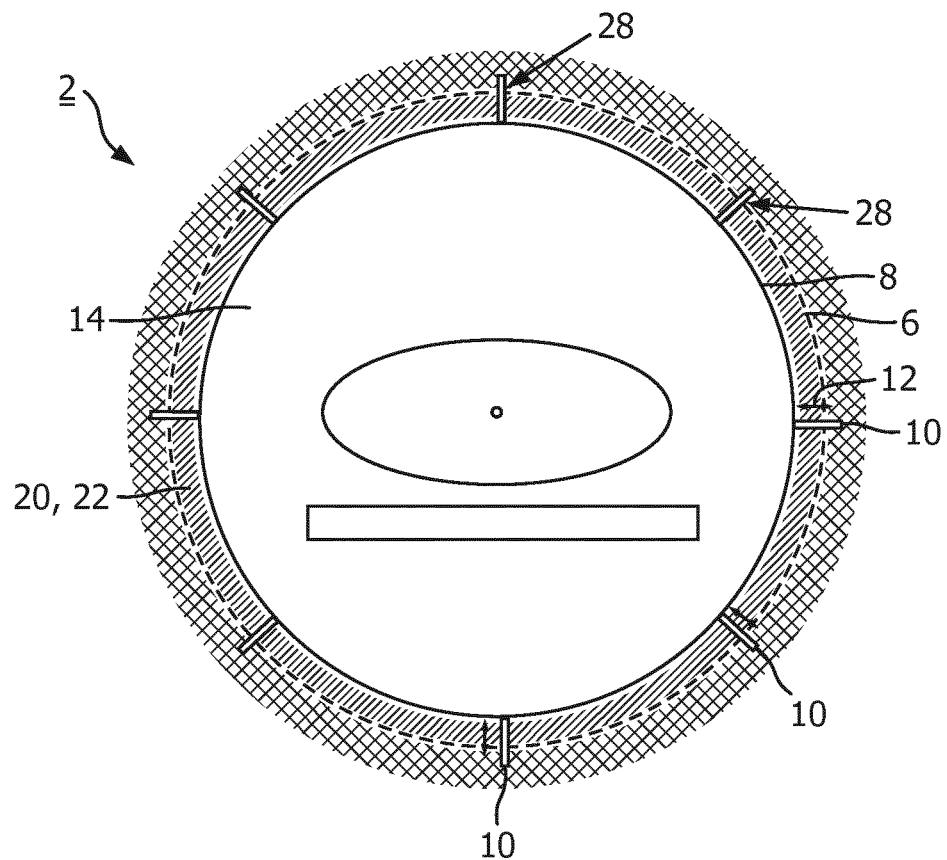
FIG. 3 shows the cross sectional view of the RF body coil, wherein the RF body coil is back anchored in a gradient coil of an MRI system, according to the preferred embodiment of the invention.

FIG. 3 shows the RF body coil 2, wherein the coil former 20 and the flexible layer 22 are formed as a double layer package. Furthermore, the RF shield 6 comprises a plurality of feed through apertures 28 arranged in radial direction of the RF shield 6. The distance setting elements 10 are feed through the apertures 28 without mechanically connecting the distance setting to the RF shield. The distance setting element 10 is configured as a screw mechanism 11, wherein the screw mechanism 11 is inserted from the inner volume 14 and connected to the RF coil element 8. The RF body coil 2 is arranged in a gradient coil 30 of an MRI system. The screw mechanism 11 is back anchored in the gradient coil 30. Thus, the screw mechanism 11 enables to fix the RF body coil 2 to the gradient coil 30. Tightening the screw mechanism 11 leads to a local deformation of the RF coil element 8, reducing the relative distance 12 between the RF coil element 8 and the RF shield 6, which immediately leads to a change of resonance of the RF coil element 8.

Figure 4:
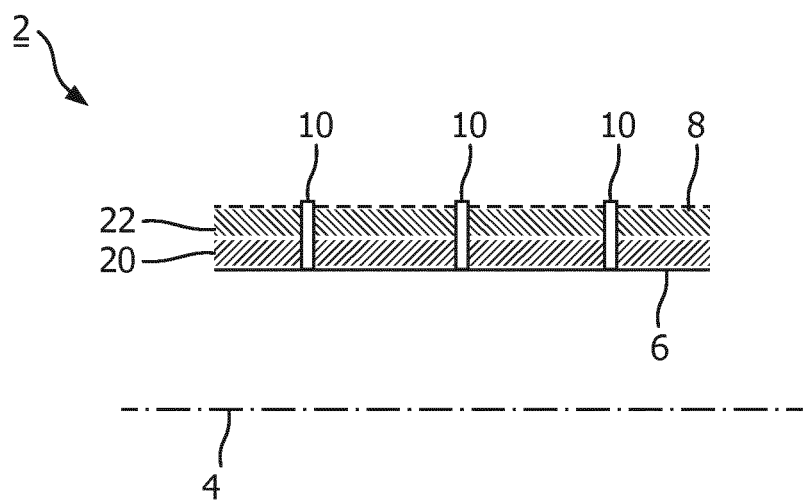
FIG. 4 shows a part of a cross sectional view of the RF body coil in longitudinal axis, according to the preferred embodiment of the invention.

FIG. 4 shows a cross sectional view in longitudinal axis 4 of the RF body coil 2, known from FIG. 2, showing the plurality of distance setting elements 10 in longitudinal direction of the RF body coil 2.

Figure 5:
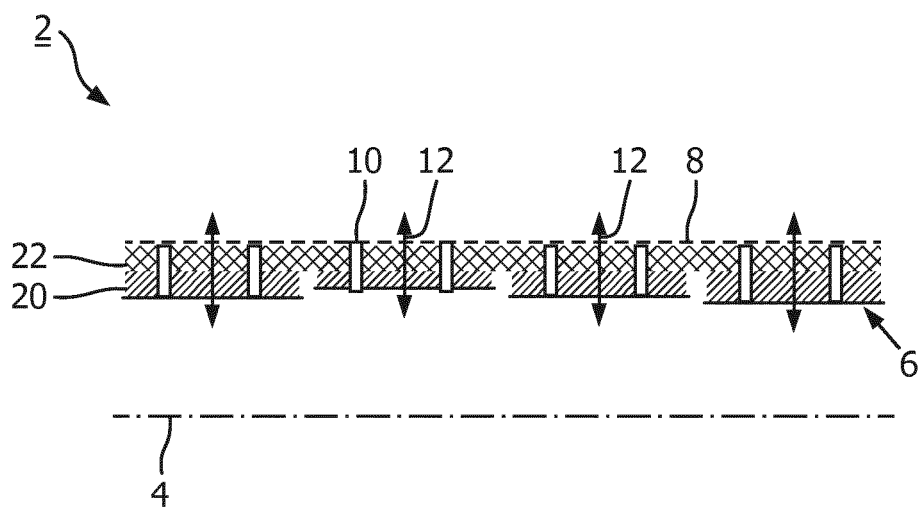
FIG. 5 shows a part of a cross sectional view of the RF body coil in longitudinal axis, wherein the RF coil element comprises adjustable rungs, according to a preferred embodiment of the invention, FIG. 6 show a cross sectional view of the RF body coil, wherein the distance setting elements is configured as a fixation band, according to a preferred embodiment of the invention.

FIG. 5 shows a cross sectional view in longitudinal axis 4 of the RF body coil 2 wherein the RF coil element 8 is configured as printed circuit board (pcb) based resonators having a plurality of rungs of individual segments in longitudinal direction of the RF body coil 2. Each segment comprises a plurality of distance setting elements 10. Thus, each segment can be tuned to resonance by changing the relative distance 12 between the pcb-based resonators and the RF shield 6.

Figure 6:
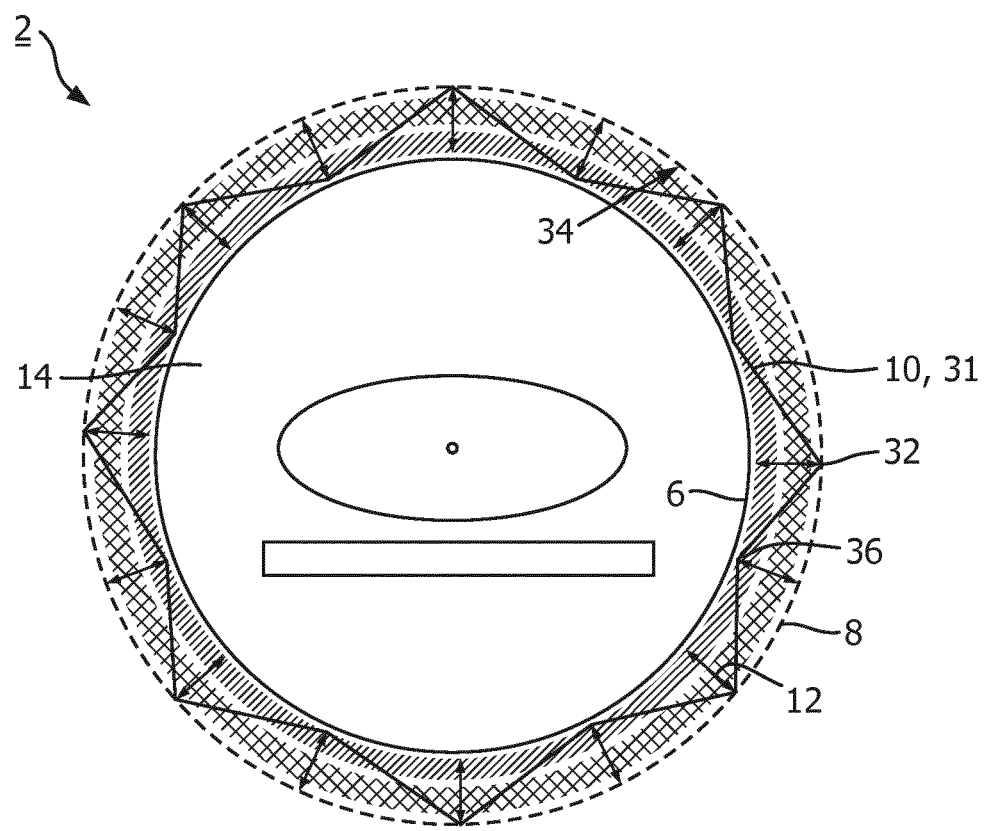

FIG. 6 shows the RF body coil 2 according to FIG. 2 wherein the distance setting element 10 is configured as a fixation band 31. The RF shield 6 comprises first connection elements 32 equidistantly spaced to each other on a shield surface 34 facing the RF coil element 8. The RF coil element 8 comprises second connection elements 36 equidistantly spaced to each other. The first connection elements 32 and the second connections elements 36 are arranged with an offset to each other. The fixation band 10 is connected between the first connection elements 32 and the second connection elements 36, and the length of the fixation band 10 is adjustable via the second connections elements 36 operable from the inner volume 14. Thus, by adjusting the length of the fixation band 10, the RF coil element 8 and/or the RF shield element 8 can be locally deformed.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

LIST OF REFERENCE NUMERALS

2 RF body coil
4 Longitudinal axis
6 RF shield
8 RF coil element
10 Distance setting element
11 Screw mechanism
12 Local distance
14 Inner volume
16 Patient table
18 Volume of interest
20 Coil Former
22 Flexible layer
24 Inner surface
26 Outer surface
28 Feed through aperture
30 Gradient Coil 31 Fixation band
32 First connection elements
34 Shield surface
36 Second connection elements

The invention claimed is:

1. A radio frequency (RF) body coil, comprising:
an RF shield,
an RF coil element, distantly arranged from the RF shield, and
at least one distance setting element, arranged in such a way that a relative distance between the RF shield and the RF coil element is locally adjustable via the distance setting element by locally deforming the RF coil element and/or the RF shield, wherein the distance setting element is configured to mechanically connect the RF coil element and the RF shield to each other.

2. The RF body coil of claim 1, wherein the at least one distance setting element is configured as one selected from a group consisting of a screw mechanism, a fixation band and an eccentric screw.

3. The RF body coil of claim 1, wherein the RF shield comprises a feed through aperture arranged in a radial direction of the RF shield and the at least one distance setting element is fed through the aperture.

4. The RF body coil of claim 2, wherein the RF body coil is cylindrically arranged, wherein the at least one distance setting element is configured as a fixation band, wherein in a cross-sectional area in a direction perpendicular to a longitudinal axis of the cylindrically arranged RF body coil:
the RF shield comprises first connection elements on a shield surface facing the RF coil element,
the RF coil element comprises second connection elements, equidistantly spaced with respect to each other,
the first connection elements and the second connection elements are arranged aligned to each other,
wherein the fixation band is connected between the first connection elements and the second connection elements, and
a length of the fixation band is adjustable via the second connection elements.

5. The RF body coil of claim 1, wherein the at least one distance setting element comprises a plurality of distance setting elements.

6. The RF body coil of claim 1, further comprising a flexible layer at least partially disposed between the RF coil element and the RF shield.

7. The RF body coil of claim 1, further comprising a solid coil former, wherein the RF shield or the RF coil element is arranged on the solid coil former.

8. The RF body coil of claim 1, wherein the RF coil element comprises a resonator element or a plurality of electrically conducting strips.

9. The RF body coil of claim 1, wherein the RF coil element is formed as a birdcage coil comprising two circular conductive loops connected by a plurality of conductive straight elements and using capacitive structures to form a resonator.

10. The RF body coil of claim 1, wherein the RF coil element is formed as a transverse electromagnetic (TEM) resonator coil.

11. The RF body coil of claim 4, wherein the first connection elements are equidistantly spaced relative to each other.

12. The RF body coil of claim 8, wherein the resonator element is a printed circuit board (pcb)-based resonator.

13. The RF body coil of claim 2,
wherein the RF body coil is cylindrically arranged,
wherein the at least one distance setting element is configured as a fixation band,
wherein in a cross-sectional area in a direction perpendicular to a longitudinal axis of the cylindrically arranged RF body coil:
the RF shield comprises first connection elements on a shield surface facing the RF coil element,
the RF coil element comprises second connection elements, equidistantly spaced with respect to each other,
the first connection elements and the second connection elements are offset with respect to each other,
the fixation band is connected between the first connection elements and the second connection elements, and
a length of the fixation band is adjustable via the second connection elements.

14. A magnetic resonance imaging (MRI) system, comprising:
a patient tunnel;
a radio frequency (RF) body coil, comprising:
an RF shield,
an RF coil element, disposed separate and apart from the RF shield,
at least one distance setting element, disposed such that a relative distance between the RF shield and the RF coil element is locally adjustable via the distance setting element by locally deforming the RF coil element and/or the RF shield, wherein the distance setting element is configured to mechanically connect the RF coil element and the RF shield to each other, and
a solid coil former, wherein the RF shield or the RF coil element is arranged on the coil former,
wherein the solid coil former comprises an inner surface and an outer surface, and the inner surface is averted to the outer surface, and
wherein the inner surface faces a center of the patient tunnel.

15. The MRI system of claim 14, further comprising a flexible layer at least partially disposed between the RF coil element and the RF shield,
wherein the RF shield is mounted on the outer surface of the solid coil former,
wherein the flexible layer is arranged on the inner surface of the solid coil former, and
wherein the RF coil element is arranged on the flexible layer, wherein the flexible layer is disposed between the RF coil element and the solid coil former.

16. The MRI system of claim 14, further comprising a flexible layer at least partially disposed between the RF coil element and the RF shield,
wherein the RF coil element is arranged on the outer surface of the coil former,
wherein the flexible layer is arranged on the RF coil element,
wherein the RF coil element is positioned between the coil former and the flexible layer, and
wherein the RF shield is arranged on the flexible layer.

17. The MRI system of claim 14, wherein the at least one distance setting element comprises a plurality of distance setting elements.

18. The MRI system of claim 14, wherein the at least one distance setting element is configured as one selected from a group consisting of a screw mechanism, a fixation band and an eccentric screw.

19. The MRI system of claim 14, wherein the RF shield comprises a feed through aperture arranged in a radial direction of the RF shield and the at least one distance setting element is fed through the aperture.

20. A method for tuning a radio frequency (RF) body coil in a magnetic resonance imaging (MRI) system, wherein the RF body coil includes an RF shield, an RF coil element, distantly arranged from the RF shield, and at least one distance setting element, arranged in such a way that a relative distance between the RF shield and the RF coil element is locally adjustable via the distance setting element by locally deforming the RF coil element and/or the RF shield, wherein the distance setting element is configured to mechanically connect the RF coil element and the RF shield to each other, the method comprising:
- measuring at least one of a frequency of the RF coil element and a homogeneity of an RF field of the RF body coil; and
- adjusting the relative distance between the RF coil element and the RF shield via the at least one distance setting element, which mechanically connects the RF coil element and the RF shield to each other, by locally deforming the RF coil element and/or the RF shield to change at least one of the frequency of the RF coil element and the homogeneity of the RF field.

* * * * *